(12) United States Patent
Gau

(10) Patent No.: US 7,071,070 B2
(45) Date of Patent: Jul. 4, 2006

(54) METHOD OF FABRICATING CAPACITOR

(75) Inventor: Jing-Horng Gau, Hsinchu Hsien (TW)

(73) Assignee: United Microelectronics Corp., Hsinchu (TW)

(*) Notice: Subject to any disclaimer, the term of this patent is extended or adjusted under 35 U.S.C. 154(b) by 11 days.

(21) Appl. No.: 10/711,533

(22) Filed: Sep. 24, 2004

(65) Prior Publication Data
US 2006/0068559 A1   Mar. 30, 2006

(51) Int. Cl.
H01L 21/20 (2006.01)
(52) U.S. Cl. .............. 438/382; 438/383; 438/384; 438/385; 438/386; 438/381; 438/393; 438/394
(58) Field of Classification Search ............. 438/382, 438/383, 384, 385, 386, 381, 393, 394
See application file for complete search history.

(56) References Cited

U.S. PATENT DOCUMENTS
6,190,987 B1 * 2/2001 Kasai et al. ............... 438/381

* cited by examiner

Primary Examiner—W. David Coleman
Assistant Examiner—Nicholas J. Tobergte
(74) Attorney, Agent, or Firm—Jiang Chyun IP Office

(57) ABSTRACT

A method of fabricating a capacitor is described. A dielectric layer is formed over a substrate. An upper electrode having multiple openings therein is formed over the dielectric layer. Then, a doping step is performed to the substrate through the openings to form a single doped region as a lower electrode in the substrate under the upper electrode.

26 Claims, 5 Drawing Sheets (a)

(b)

METHOD OF FABRICATING CAPACITOR

BACKGROUND OF THE INVENTION

1. Field of the Invention

The present invention relates to a method of fabricating a semiconductor device. More particularly, the present invention relates to a method of fabricating a capacitor that can improve the quality of the inter-electrode dielectric layer and reduce the electrical resistance of the lower electrode to increase the Q-factor of the capacitor.

2. Description of the Related Art

In the prior art, a capacitor compatible to MOS process usually has a metal-insulator-metal (MIM) structure or metal-insulator-silicon (MIS) structure. However, a MIM or MIS capacitor suitable to high-voltage applications is usually insufficient in the capacitance per unit area. Meanwhile, for mixed-mode devices or RF devices including capacitors, it is frequently required to save a large area of the die for the capacitors to achieve sufficient capacitance satisfying the design rule. However, after the semiconductor industry advanced to deep sub-micron generation, increasing the capacitor area will reduce the integration degree of devices more significantly so that the economic effect of manufacture is lowered more. Therefore, increasing the unit-area capacitance of the capacitors is always desired in the semiconductor industry.

In view of the foregoing, a capacitor fabricating method integrated with MOS process is proposed. In the method, a doped region is formed in a semiconductor substrate as a lower electrode, and then an oxide layer as the dielectric layer of the capacitor is grown on the doped region simultaneously with the gate oxide layers in the MOS area on the same die. A polysilicon layer is formed covering the capacitor dielectric layer and the gate oxide layer, and is then patterned into gates and an upper electrode of the capacitor.

Nevertheless, since the dielectric layer is formed after the doping step for forming the lower electrode, the quality thereof is not good. Meanwhile, the dopant concentration in the doped region is not so uniform. Moreover, the lower electrode constituted of a doped region has a higher resistance than metal, so that the Q-factor of the capacitor is usually too small to satisfy high-frequency applications.

SUMMARY OF THE INVENTION

Accordingly, one object of this invention is to provide a method of fabricating a capacitor that can improve the quality of the capacitor dielectric layer.

Another object of this invention is to provide a method of fabricating a capacitor that can lower the resistance of the capacitor to increase the Q-factor of the same.

A method of fabricating a capacitor of this invention includes the following steps. A dielectric layer is formed on a semiconductor substrate, and an upper electrode having multiple openings therein is formed on the dielectric layer. A doping step is then performed to the substrate through the openings to form a single doped region as a lower electrode in the substrate under the upper electrode.

In an embodiment of this invention, the upper electrode is made from doped polysilicon, and a spacer is further formed on the sidewall of each opening in the upper electrode after the lower electrode is formed. Then, a self-aligned silicide (salicide) process is performed to form meal silicide layers on the upper electrode and the exposed portions of the doped region as the lower electrode.

In another embodiment of this invention, the upper electrode is also made from doped polysilicon. However, this embodiment differs from the previously one in that a liner layer is formed on the sidewall of each opening prior to formation of the spacer and the spacer is removed before the salicide process. The spacer is removed to increase the area of the metal silicide layer that will be formed on the lower electrode.

Since the dielectric layer is formed before the doping step, the quality of the dielectric layer under the upper electrode is better. Moreover, by incorporating a salicide process after the lower electrode is formed, the resistance of each of the upper and lower electrodes can be reduced to increase the Q-factor of the capacitor.

It is to be understood that both the foregoing general description and the following detailed description are exemplary, and are intended to provide further explanation of the invention as claimed.

DESCRIPTION OF THE PREFERRED EMBODIMENTS

First Embodiment

Figure 1A:
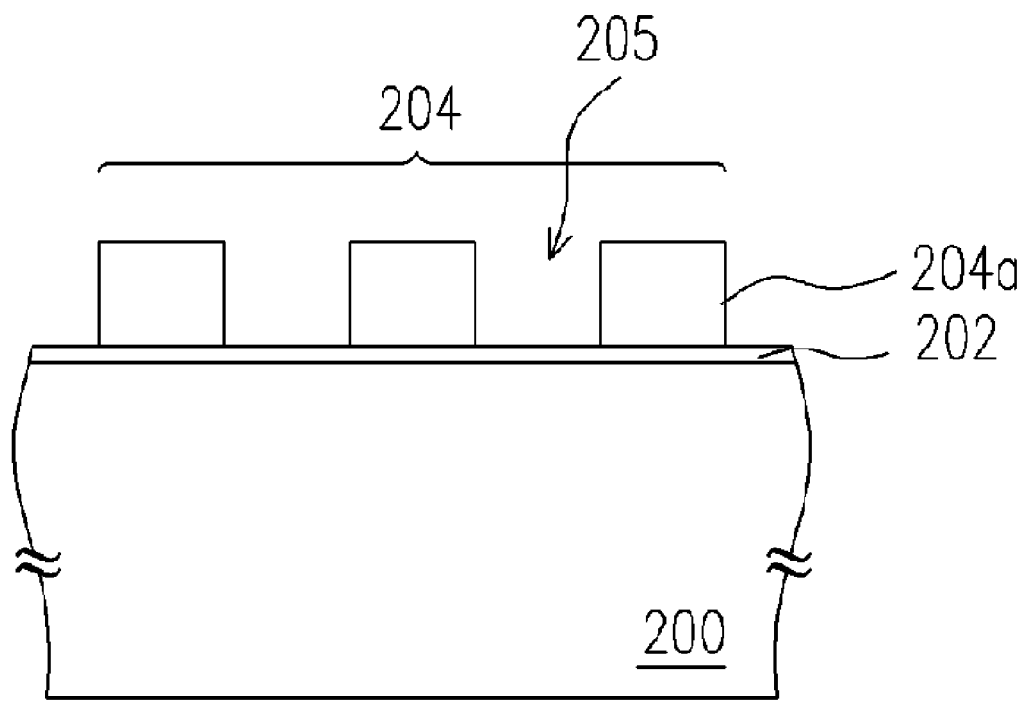
FIGS. 1A and 1B(a)/(b) illustrate a process flow of fabricating a capacitor according to a first embodiment of this invention in a cross-sectional view, wherein two different doping methods for forming the lower electrode are shown in FIG. 1B(a) and FIG. 1B(b), respectively.
Figure 1B:
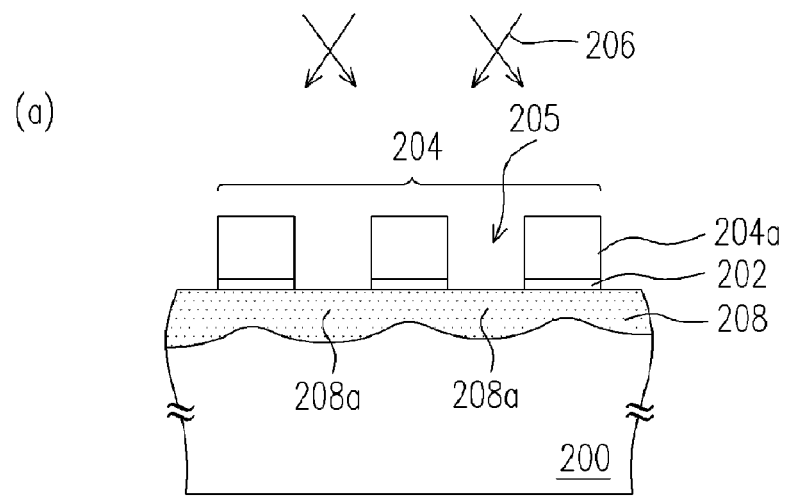
Figure 1B:
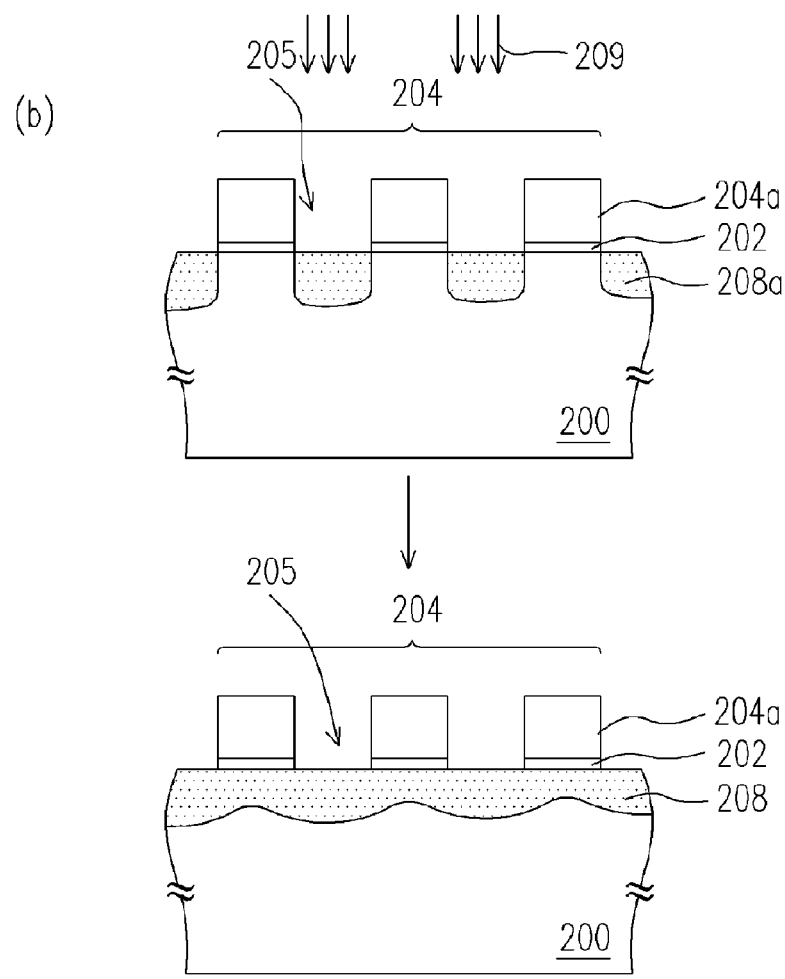

FIGS. 1A and 1B(a)/(b) illustrate a process flow of fabricating a capacitor according to the first embodiment of this invention in a cross-sectional view, wherein two different doping methods for forming the lower electrode are shown in FIG. 1B(a) and FIG. 1B(b), respectively.

Referring to FIG. 1A, a semiconductor substrate 200 is provided, which may be a single-crystal silicon substrate. A dielectric layer 202 is formed on the substrate 200, preferably together with the gate dielectric layers in the MOS area (not shown) of the same substrate 200. For example, the dielectric layer 202 can be a silicon oxide layer that is formed simultaneously with the gate oxide layers in the MOS area through thermal oxidation.

Then, an upper electrode 204 having multiple openings 205 therein is formed on the dielectric layer 202. The steps for forming the upper electrode 204 may include forming a doped polysilicon layer on the dielectric layer 202 and patterning the same with a lithography process and an etching process, which may also remove the dielectric layer 202 exposed in the openings 205, as shown in FIG. 1B. The upper electrode 204 is preferably formed simultaneously with the gates in the MOS area (not shown). That is, the upper electrode 204 and the gates in the MOS area can be formed from the same conductive layer, such as, a doped polysilicon layer as mentioned in the above example.

Figure 4:
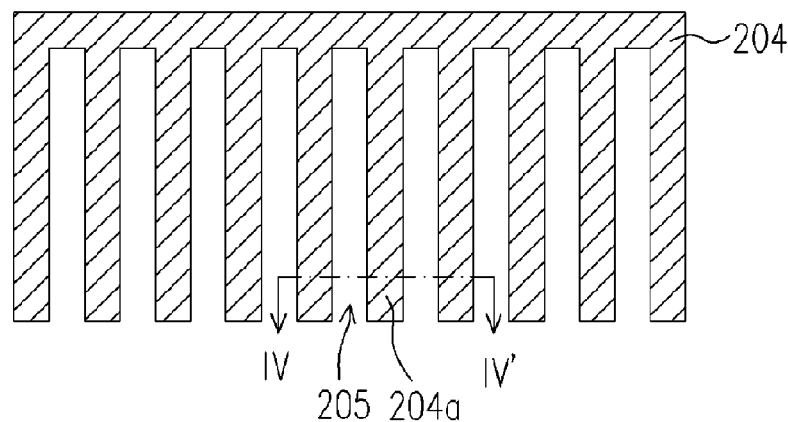
FIG. 4 illustrates an example of an upper electrode structure of a capacitor according to the embodiments of this invention in a top view.
Figure 5:
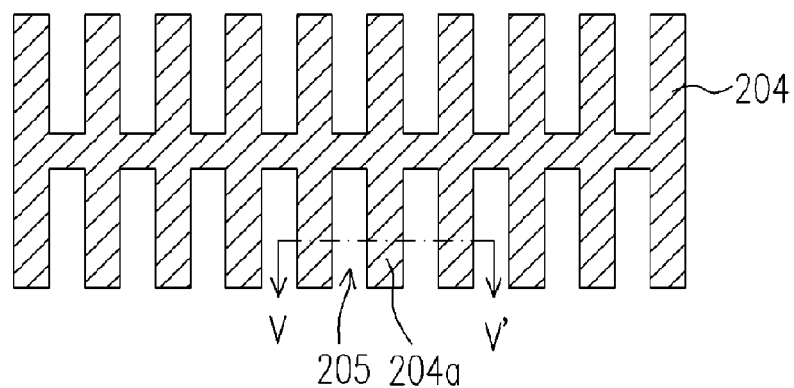
FIG. 5 illustrates another example of an upper electrode structure of a capacitor according to the embodiments of this invention in a top view.
Figure 6:
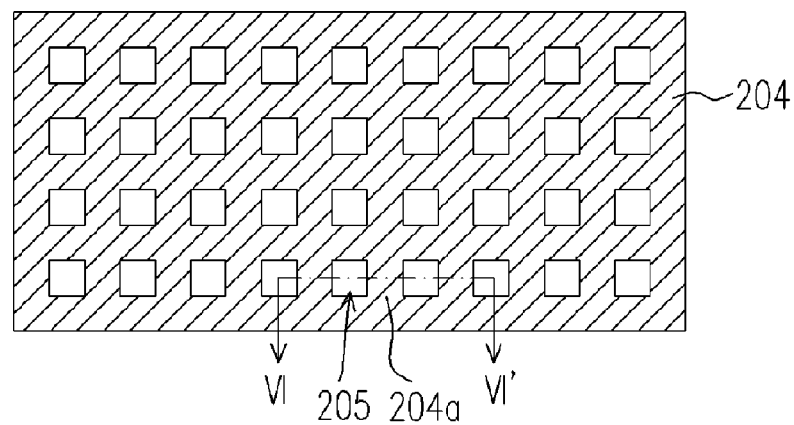
FIG. 6 illustrates yet another example of an upper electrode structure of a capacitor according to the embodiments of this invention in a top view.

In a top view, the upper electrode 204 may include multiple bar-like conductive layers 204a connected to each other with trench-like openings 205 between them. Examples of such an upper electrode structure include a comb-like structure as shown in FIG. 4 and a fishbone-like structure as shown in FIG. 5. Alternatively, the upper electrode 204 may have a net-like structure as shown in FIG. 6, which has multiple meshes therein as the openings 205. The line IV-IV'/V-V'/VI-VI' in FIGS. 4/5/6 corresponds to the cross-section of FIG. 1A.

Referring to FIG. 1B(a)/(b), a doping step is then performed to the substrate 200 through the openings 205 in the upper electrode 204 to form a doped region 208 as a lower electrode under the upper electrode 204. The doping step can be done with tilt ion implantation 206, as shown in FIG. 1B(a). With the tilt ion implantation 206, a doped region 208a is formed under each opening 205 extending to the substrate 200 under the portions 204a of the upper electrode 204 to connect adjacent doped regions 208a, so that the doped regions 208a merge into a single doped region 208.

Referring to FIG. 1B(b), the doping step may alternatively includes vertical ion implantation 209 for forming multiple doped regions 208a under the openings 205, and an annealing process for diffusing the implanted dopants to make the doped regions 208a merge into a single doped region 208.

Since the dielectric layer 202 is formed before the doping step for forming the lower electrode 208, the quality of the dielectric layer 202 is better than that in the prior art. Moreover, when the dielectric layer 202 formed before the doping step is formed with thermal oxidation, the thickness thereof can be about one half of that of an oxide layer formed with thermal oxidation after the doping step as in the prior art. An oxide layer formed on a heavily doped substrate with thermal oxidation, as in the prior art, is thicker because of the high dopant concentration in the substrate. Accordingly, the capacitance of the capacitor is not reduced even though the area of the upper electrode 204 is reduced due to presence of the openings 205.

Second Embodiment

Figure 2A:
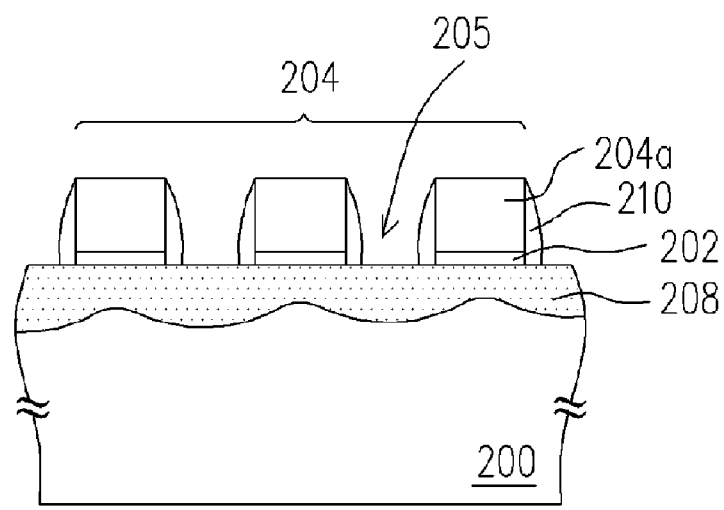
FIGS. 2A–2B illustrate a latter part of a process flow of fabricating a capacitor according to a second embodiment of this invention in a cross-sectional view.
Figure 2B:
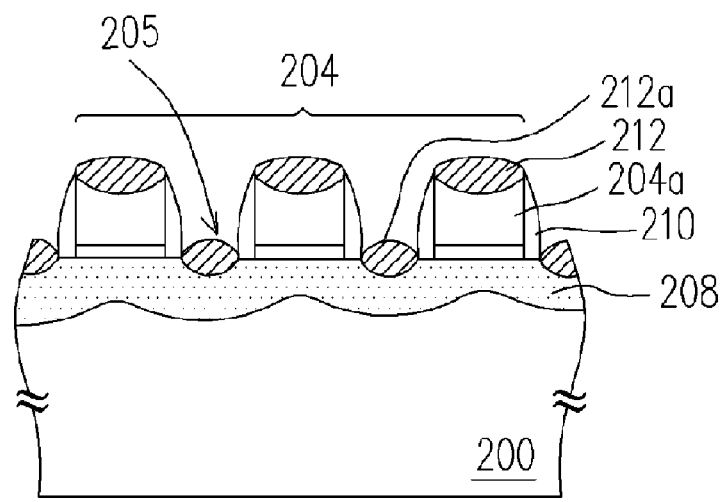

FIGS. 2A–2B illustrate a latter part of a process flow of fabricating a capacitor according to the second embodiment of this invention in a cross-sectional view. The former part of the process flow is described in the first embodiment, while the step of FIG. 2A is subsequent to the step of FIG. 1B and the same elements are labeled with the same reference numbers.

Referring to FIG. 2A, a spacer 210 is formed on the sidewall of each opening 205 in the upper electrode 204. The spacers 210 may be formed simultaneously with the spacers on the sidewalls of the gates in a MOS area (not shown) on the same substrate 200. The spacers 210 are formed by, for example, forming a conformal insulating layer (not shown) over the substrate 200 and then anisotropically etching the same to remove portions thereof. The material of the insulating layer may be silicon nitride, and the method for forming the same is chemical vapor deposition (CVD), for example.

Referring to FIG. 2B, a self-aligned silicide (salicide) is conducted to form metal silicide layers 212 and 212a on the top of the upper electrode 204 and the exposed surfaces of the doped region 208, respectively. The material of the metal silicide layer 212/212a can be a silicide of a refractory metal, wherein the refractory metal is selected from the group consisting of Ti, W, Pt, Co and Ni. In a salicide process forming titanium silicide, for example, a titanium layer of about 300 Å in thickness is formed over the substrate 200 with sputtering. Then, a rapid thermal process is conducted under 700° for 20 seconds to react the titanium layer with underlying silicon atoms of the upper electrode 204 and the substrate 200 to form titanium silicide layers thereon. The unreacted titanium metal is then removed using selective wet etching.

Since metal silicide layers 212/212a are formed on the upper electrode 204 and the exposed surfaces of the doped region 208 as the lower electrode, the bulk resistance and contact resistance of the upper and lower electrodes can be reduced to increase the Q-factor of the capacitor.

Third Embodiment

Figure 3A:
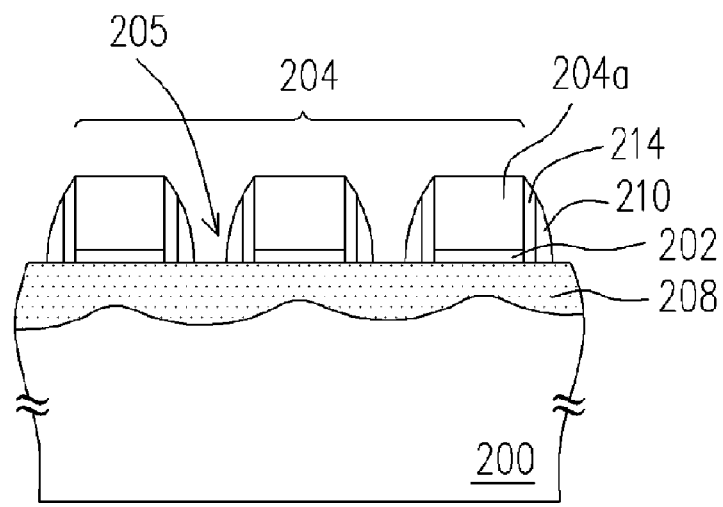
FIGS. 3A–3B illustrate a latter part of a process flow of fabricating a capacitor according to a third embodiment of this invention in a cross-sectional view.
Figure 3B:
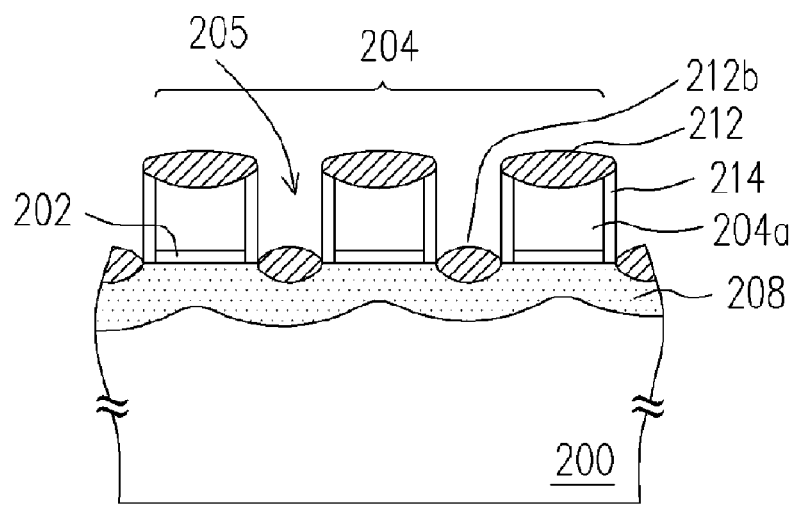

FIGS. 3A–3B illustrate a latter part of a process flow of fabricating a capacitor according to the third embodiment of this invention in a cross-sectional view. The former part of the process flow is described in the first embodiment, while the step of FIG. 3A is subsequent to the step of FIG. 1B and the same elements are labeled with the same reference numbers.

Referring to FIG. 3A, after the lower electrode 208 is formed, a liner layer 214 is formed on the sidewall of each opening 205 in the upper electrode 204, and then a spacer 210 is formed on each liner layer 214. The liner layer 214 may include silicon oxide and may be formed with thermal oxidation, for example. The forming method and the material of the spacer 210 may be the same as those in the second embodiment.

Referring to FIG. 3B, the spacers 210 are removed with, for example, isotropic etching, leaving the liner layers 214 on the sidewalls of the openings 205. It is particularly noted that the liner layers 214 and the spacers 210 are formed sequentially in a MOS process designed for the MOS area on the same substrate 200, while the spacers 210 are removed to increase the exposed area of the lower electrode 208. When the MOS process does not form spacers, the step of forming spacers on sidewalls of the openings 205 and the step of removing spacers surely can be saved.

Referring to FIG. 3B again, a salicide process is conducted to form metal silicide layers 212 and 212b on the top of the upper electrode 204 and the exposed surfaces of the doped region 208, respectively. The material of the metal silicide layer 212/212a can be a silicide of a refractory metal, wherein the refractory metal is selected from the group consisting of Ti, W, Pt, Co and Ni.

Since metal silicide layers 212/212b are formed on the upper electrode 204 and the exposed surfaces of the doped region 208 as the lower electrode, the bulk resistance and the contact resistance of the upper and lower electrodes can be reduced to increase the Q-factor of the capacitor. In addition, the bulk resistance and the contact resistance of the lower electrode 208 is even lower than those of the lower electrode in the second embodiment, since the spacers 210 are removed to increase the exposed area of the lower electrode 208.

In summary, since the dielectric layer is formed before the doping step, the quality of the dielectric layer is better than that in the prior art. Moreover, since metal silicide layers are formed on the upper electrode and the exposed surfaces of the doped region as the lower electrode, the bulk resistance and the contact resistance of the upper and lower electrodes can be reduced to increase the Q-factor of the capacitor.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a capacitor, comprising:
   forming a dielectric layer on a semiconductor substrate;
   forming an upper electrode on the dielectric layer, the upper electrode having a plurality of opening therein;
   performing a doping step to the semiconductor substrate through the openings to form a single doped region as a lower electrode in the semiconductor substrate under the upper electrode; and
   forming a plurality of metal silicide layers on portions of the single doped region within the openings.

2. The method of claim 1, wherein the doping step comprises a tilt ion implantation process.

3. The method of claim 1, wherein the doping step comprises;
   conducting a substantially vertical ion implantation process to form & plurality of dope regions in the substrate under the openings; and
   conducting an annealing process to make the doped regions merge into the single doped region.

4. The method of claim 1, wherein the step of forming the upper electrode on the dielectric layer comprises:
   forming a conductive layer on the dielectric layer; and
   patterning the conductive layer into the upper electrode with a lithography process and an etching process.

5. The method of claim 1, wherein the upper electrode includes a plurality of bar-like conductive layers connecting with each other, and the openings in the upper electrode are trench-like openings between the bar-like conductive layers.

6. The method of claim 5, wherein the upper electrode has a comb-like structure or a fishbone-like structure.

7. The method of claim 1, wherein the upper electrode has a net-like structure.

8. A method of fabricating a capacitor, comprising:
   forming a dielectric layer on a silicon substrate;
   forming an upper electrode on the dielectric layer, the upper electrode comprising doped polysilicon and having a plurality of opening therein;
   performing a doping step to the substrate through the openings to form a single doped region as a lower electrode in the substrate under the upper electrode;
   forming a spacer on a sidewall of each opening in the upper electrode; and
   performing a self-aligned silicide (salicide) process to form a plurality of metal silicide layers on the upper electrode and portions of the single doped region within the openings.

9. The method of claim 8, wherein the doping step comprises a tilt ion implantation process.

10. The method of claim 8, wherein the doping step comprises:
    conducting a substantially vertical ion implantation process to form a plurality of doped regions in the substrate under the openings; and
    conducting an annealing process to make the doped regions merge into the single doped region.

11. The method of claim 8, wherein the step of forming the upper electrode on the dielectric layer comprises:
    forming a conductive layer on the dielectric layer; and
    patterning the conductive layer into the upper electrode with a lithography process and an etching process.

12. The method of claim 8, wherein the upper electrode includes a plurality of bar-like conductive layers connecting with each other, and the openings in the upper electrode arc trench-like openings between the bar-like conductive layers.

13. The method of claim 12, wherein the upper electrode has a comb-like structure or a fishbone-like structure.

14. The method of claim 8, wherein the upper electrode has a net-like structure.

15. The method of claim 8, wherein the metal silicide layers comprise a suicide of a refractory metal.

16. The method of claim 15, wherein the refractory metal is selected from the group consisting of Ti, W, Pt, Co and Ni.

17. A method of fabricating a capacitor, comprising:
    forming a dielectric layer on a silicon substrate;
    forming an upper electrode on the dielectric layer, the upper electrode comprising doped polysilicon and having a plurality of opening therein;
    performing a doping step to the substrate through the openings to form a single doped region as a lower electrode in the substrate under the upper electrode;
    forming a liner layer on a sidewall of each opening in the upper electrode;
    forming a spacer on each liner layer on a sidewall of an opening;
    removing the spacer; and
    performing a self-aligned silicide (salicide) process to form a plurality of metal silicide layers on the upper electrode and portions of the single doped region within the openings.

18. The method of claim 17, wherein the doping step comprises a tilt ion implantation process.

19. The method of claim 17, wherein the doping step comprises:
    conducting a substantially vertical ion implantation process to form a plurality of doped regions in the substrate under the openings; and
    conducting an annealing process to make the doped regions merge into the single doped region.

20. The method of claim 17, wherein the step of forming the upper electrode on the dielectric layer comprises:
    forming a conductive layer on the dielectric layer; and
    patterning the conductive layer into the upper electrode with a lithography process and an etching process.

21. The method of claim 17, wherein the upper electrode includes a plurality of bar-like conductive layers connecting with each other, and the openings in the upper electrode are trench-like openings between the bar-like conductive layers.

22. The method of claim 21, wherein the upper electrode has a comb-like structure or a fishbone-like structure.

23. The method of claim 17, wherein the upper electrode has a net-like structure.

24. The method of claim 17, wherein the metal silicide layers comprise a silicide of a refractory metal.

25. The method of claim 24, wherein the refractory metal is selected from the group consisting of Ti, W, Pt, Co and Ni.

26. The method of claim 1, wherein forming a plurality of metal silicide layers on portions of the single doped region within the openings comprises steps of:
    forming a spacer on a sidewall of each opening in the upper electrode; and performing a self-aligned silicide (salicide) process to form a plurality of metal silicide layers on the upper electrode and portions of the single doped region within the openings.

* * * * *